US006754351B1

(12) United States Patent
Tanji

(10) Patent No.: US 6,754,351 B1
(45) Date of Patent: Jun. 22, 2004

(54) MUSIC APPARATUS WITH DYNAMIC CHANGE OF EFFECTS

(75) Inventor: Ryoji Tanji, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/082,857

(22) Filed: May 21, 1998

(30) Foreign Application Priority Data

May 22, 1997 (JP) ............................................ 9-132657

(51) Int. Cl.[7] .............................. H03G 3/00; G10F 1/02
(52) U.S. Cl. ....................... 381/61; 381/63; 84/DIG. 26
(58) Field of Search .................... 381/61, 63, 104–107; 84/629–630, DIG. 26; 712/35

(56) References Cited

U.S. PATENT DOCUMENTS 5,613,147 A * 3/1997 Okamura et al. ............. 381/63
5,652,797 A 7/1997 Okamura et al.
5,703,312 A * 12/1997 Takahashi et al. ............ 381/61
5,862,231 A * 1/1999 Tokuhisa ..................... 381/61
6,031,916 A * 2/2000 Saito et al. ................... 381/61
6,189,085 B1 * 2/2001 Miyata ........................ 712/37

* cited by examiner

*Primary Examiner*—Minsun Oh Harvey
*Assistant Examiner*—Laura A. Grier
(74) *Attorney, Agent, or Firm*—Morrison & Foerster LLP

(57) ABSTRACT

A music effector apparatus is constructed for processing a digital audio signal to produce a music sound while imparting acoustic effects to the music sound by executing microprograms corresponding to the acoustic effects. In the music effector apparatus, a digital signal processor has a process capacity only sufficient to execute a limited number of microprograms in parallel to each other to create corresponding acoustic effects in production of the music sound. An operating panel is manually operable when changing the acoustic effects during the production of the music sound for setting an acoustic effect to a zero level so that the corresponding microprogram is made inactive, and for setting another acoustic effect to other level than the zero level so that the corresponding microprogram is made active. A controller controls the digital signal processor to execute one or more of the active microprograms within the limited number while skipping execution of the inactive microprogram to thereby achieve efficient use of the process capacity of the digital signal processor.

13 Claims, 7 Drawing Sheets

MUSIC APPARATUS WITH DYNAMIC CHANGE OF EFFECTS

BACKGROUND OF THE INVENTION

1. Field of the Invention

The present invention generally relates to an effector imparting a sound effect to an input tone by executing a plurality of microprograms within a limited processing capacity of the effector, and outputting the tone imparted with the sound effect. The present invention also relates to a machine readable medium storing a program for controlling the effector.

2. Description of Related Art

Conventional effectors that impart a desired sound effect to an input tone and that output the resultant tone use a DSP (Digital Signal Processor), which manipulates an input signal by repeatedly executing a microprogram on a sampling frequency basis of the input signal. Such a DSP is generally composed of a program memory for storing a microprogram, a waveform computing unit for executing this microprogram to manipulate an input signal and to output the manipulated signal, and a control register for holding data necessary for executing the microprogram.

An effector has also been developed that uses a multi-microprogram DSP (hereafter, referred to as a multi-MP-DSP). The multi-MP-DSP stores plural microprograms in an internal program memory, and the waveform computing unit executes these microprograms concurrently. The effector of this type can impart a different desired effect to each of the input signals of plural channels.

It is necessary for the multi-MP-DSP to execute two or more microprograms in one sampling period of an input signal. However, the sampling frequency of the input signal varies dependently on required tone qualities. Generally, for a tone signal such as music sound, the sampling frequency is set to 44.1 kHz. If the number of steps of each microprogram is 128, the operating clock frequency of the waveform computing unit of the DSP needs to be 44,100×128=5,644,800 Hz or higher in order to execute one microprogram in one sampling period. Therefore, concurrent execution of n microprograms in one sampling period requires to provide a waveform computing unit that operates at a clock frequency n times as high as the above-mentioned frequency.

The multi-MP-DSP may have plural blocks for concurrently executing one microprogram, these blocks operating independently of each other. Therefore, the throughput of the DSP must be based on each of these blocks as long as the plural microprograms are allocated to these blocks separately, even if the plural microprograms are the same in content. In other words, regardless of the contents of the microprograms to be used, the operating clock frequency needs to be multiplied by n in the multi-MP-DSP. Obviously, provision of plural waveform computing units in the DSP for concurrent processing may lower the necessary operating clock frequency; however, this constitution requires a throughput n time as high as that required by the execution of one microprogram like the case described above.

Currently, if the sampling frequency of an input signal is 44.1 kHz, the number of microprograms executable by one multi-MPDSP is at most about two or three. Normally, the number of microprograms exceeding this limitation cannot be allocated to the blocks of the multi-MP-DSP. Therefore, many effects exceeding the limit cannot be simultaneously used. Even when only effects in the number lower than the above-mentioned limit are used, if the total number of effects to be used from starting of tone reproduction to ending thereof exceeds the above-mentioned limit, all necessary effects cannot be allocated to the blocks beforehand.

SUMMARY OF THE INVENTION

It is therefore an object of the present invention to provide an effector apparatus capable of setting many effects at a time and a machine readable medium storing a program for controlling this effector apparatus.

According to the invention, an effector apparatus is constructed for imparting acoustic effects to an audio signal by executing microprograms. The inventive apparatus comprises processing means having a process capacity only sufficient to execute a limited number of microprograms in parallel to each other to create acoustic effects in processing of the audio signal, setting means operable for individually selecting the microprograms and for setting a level of the acoustic effect to be created by each of the selected microprograms so that each microprogram is made inactive when the acoustic effect thereof is set to a zero level and otherwise is made active when the acoustic effect is set to other than the zero level, and controlling means for controlling the processing means to execute each active microprogram within the limited number while skipping execution of each inactive microprogram to thereby achieve efficient use of the process capacity of the processing means.

Preferably, the setting means comprises means operable in advance of the processing of the audio signal for presetting an excess number of microprograms over the limited number for selective use of the microprograms, and means operable during the course of the processing of the audio signal for dynamically setting the level of the acoustic effect to be created by each microprogram so as to reduce the number of active ones of the preset microprograms within the limited number.

Preferably, the setting means includes means manually operable during the processing of the audio signal for selecting a desired one of the audio effects and for changing the level of the selected audio effect.

Preferably, the processing means includes memory means having a memory capacity sufficient to load the limited number of the microprograms for execution thereof, and the controlling means comprises unloading means operative during the processing of the audio signal for unloading the inactive microprogram from the memory means, and loading means operative during the processing of the audio signal for loading the active microprogram into the memory means in place of the unloaded inactive microprogram so that the microprograms to be executed during the processing of the audio signal can be changed within the limited number.

Preferably, the processing means includes memory means having a memory capacity sufficient to store all of the microprograms including active ones and inactive ones, and the controlling means comprises means for selectively retrieving the active microprograms from the memory means for execution by the processing means.

Preferably, the apparatus further comprises alarm means operative when the number of the active microprograms exceeds the limited number for indicating an alarm such that the setting means can be manually operated to change at least one of the active microprograms to an inactive one by setting the acoustic effect to be created by the active microprogram to the zero level.

According to the invention, a machine readable medium is for use in an effector apparatus having a CPU and a digital signal processor for imparting acoustic effects to an audio signal by executing microprograms. The medium contains instructions executable by the CPU for causing the effector apparatus to perform the steps of operating the digital signal processor having a process capacity only sufficient to execute a limited number of microprograms in parallel to each other to create acoustic effects in processing of the audio signal, individually selecting the microprograms during the course of the processing of the audio signal, setting a level of the acoustic effect to be created by each of the selected microprograms so that each microprogram is made inactive when the acoustic effect thereof is set to a zero level and otherwise is made active when the acoustic effect is set to other than the zero level, and controlling the digital signal processor to execute each active microprogram within the limited number while skipping execution of each inactive microprogram to thereby achieve efficient use of the process capacity of the digital signal processor.

BRIEF DESCRIPTION OF THE DRAWINGS

These and other objects of the invention will be seen by reference to the description, taken in connection with the accompanying drawings, in which.

DETAILED DESCRIPTION OF PREFERRED EMBODIMENTS

This invention will be described in further detail by way of example with reference to the accompanying drawings.

Figure 1:
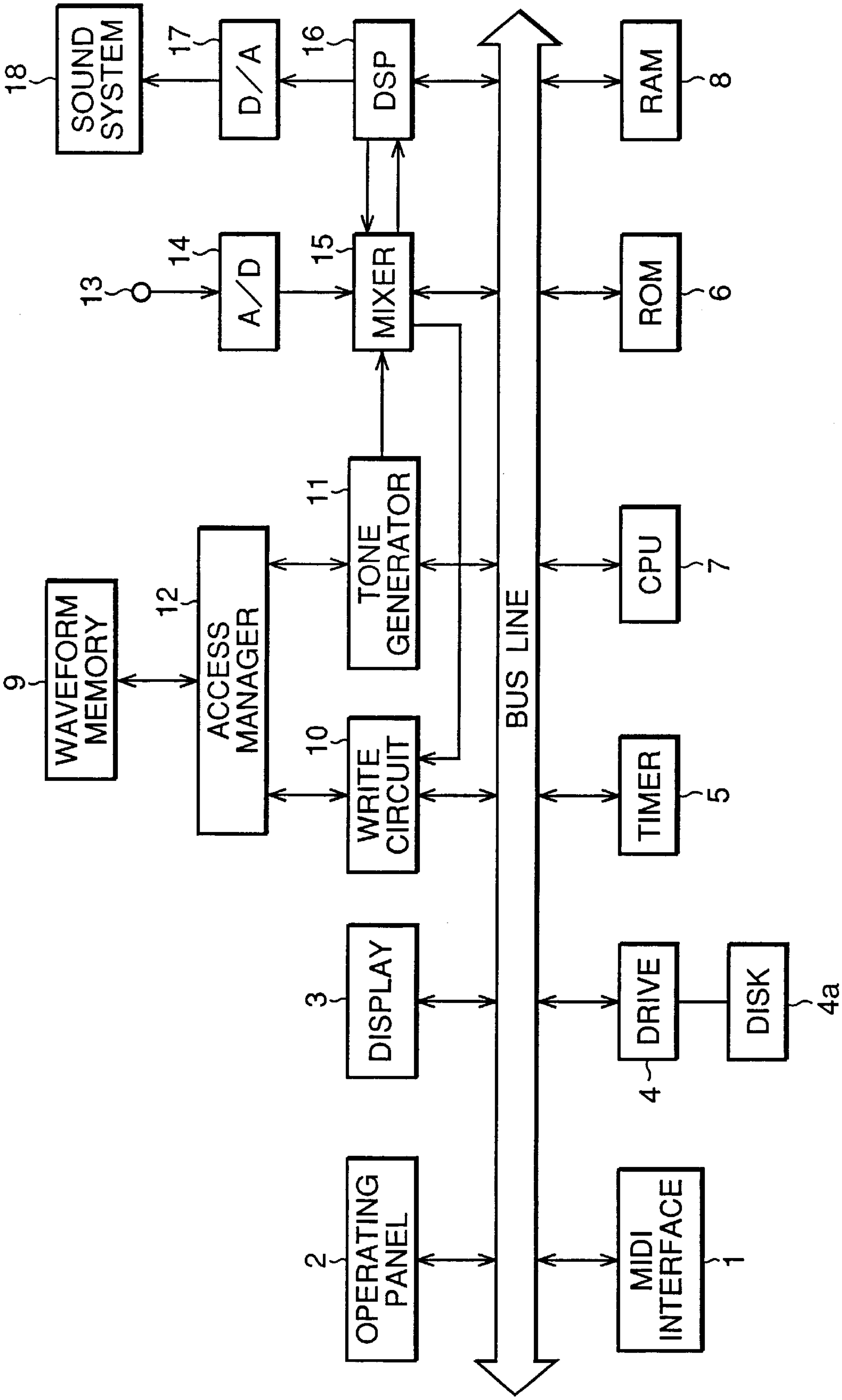
FIG. 1 is a block diagram illustrating a constitution of an electronic musical apparatus having an effector practiced as one preferred embodiment of the invention.

Now, referring to FIG. 1, there is shown a block diagram illustrating a constitution of an electronic musical apparatus having an effector practiced as one preferred embodiment of the invention. In the figure, reference numeral 1 denotes a MIDI (Musical Instrument Digital Interface) interface for inputting/outputting MIDI data. Reference numeral 2 denotes an operating panel through which a user sets various effects and makes adjustments. Reference numeral 3 denotes a display composed of an LCD (Liquid Crystal Display) panel and an LED (Light Emitting Diode) matrix. Reference numeral 4 denotes a disk drive. A disk 4*a* loaded in the drive 4 may be either a fixed machine readable medium such as a hard disk or a removable machine readable medium such as a floppy disk. The present embodiment uses a removable machine readable medium.

Reference numeral 5 denotes a timer for supplying an operating clock to other components of this electronic musical apparatus. Reference numeral 6 denotes a ROM (Read Only Memory) storing a control program for controlling this electronic musical apparatus in its entirety, microprograms for imparting various effects, and control data. Reference numeral 7 denotes a CPU (Central Processing Unit) for executing the control program. Reference numeral 8 denotes a RAM (Random Access Memory) to be used by the CPU 7 as a work memory. The CPU 7 executes the control program to control the above-mentioned components 1 through 6 and 8 as well as components 10, 11, 15, and 16 to be described later.

A waveform memory 9 that allows read/write access has a write-disabled area storing waveform data of preset standard timbres and an area for storing a predetermined length of waveform data (phrase waveform). A write circuit 10 writes the waveform data read from the disk drive 4 by the CPU 7 and the waveform data supplied from a mixer 15 onto the waveform memory 9. Reference numeral 11 denotes a tone generator that reads waveform data from the waveform memory 9 as instructed by the CPU 7, and generates tone signals based on this waveform data and an instruction (MIDI data/loop reproduction) given from the CPU 7. The tone generator 11 can simultaneously generate musical tones through plural channels (up to 64 channels in the present embodiment). An access manager 12 manages access to the waveform memory 9 from the write circuit 10 and the tone generator 11.

Reference numeral 13 denotes an external waveform input terminal for inputting a tone signal from outside of this electronic musical apparatus. Reference numeral 14 denotes an A/D converter for converting an analog tone signal inputted from the external waveform input terminal 13 into a digital signal. Reference numeral 15 denotes a mixer capable of inputting and mixing tone signals of plural channels. Reference numeral 16 denotes a DSP (Digital Signal Processor) for imparting an effect to a tone signal included in the mixed output of the mixer 15. As instructed by the CPU 7, the mixer 15 captures 64 channels of tone signals supplied from the tone generator 11, one channel of a tone signal inputted from the external waveform input terminal 13, and plural channels ($\alpha$ channels) of tone signals fed from DSP 16. The mixer 16 executes plural independent mixing operations on the inputs of these plural channels (in the present embodiment, $64+1+\alpha$ channels) in a time division manner. In addition, the mixer 15 supplies the plural channels of tone signals obtained by the mixing process to the plural inputs of the DSP 16 and the input of the write circuit 10 independently from each other. The tone signal supplied to the write circuit 10 is written to the waveform memory 9 as the above-mentioned waveform data.

On the other hand, the DSP 16 executes a microprogram on the tone signal supplied from the mixer 15, imparts an effect given by the microprogram to the tone signal, and outputs the resultant tone signal. The destination (the mixer 15 or the D/A converter 17) of the output of the DSP 16 may be set by the microprogram. For example, a constitution may be realized in which, if plural effects are imparted by the DSP 16, the input (a tone signal) for one effect is passed from the mixer 15 to the DSP 16, the tone signal returned from the DSP 16 to the mixer 15 is mixed with another tone signal to be passed to the DSP 16 again, and the mixed tone signal is given to another effect.

Actually, in the present embodiment, the mixer 15 has a capability realized by use of the above-mentioned feature, in which a predetermined length (several to several tens of seconds) of waveform data is extracted from a tone signal inputted from the external input terminal 13 and is returned via the DSP 16 as instructed by the CPU 7. The extracted waveform data is supplied to the write circuit 10 as a phrase waveform. It should be noted that a phrase waveform denotes an already performed waveform, which is obtained by recording two bars of arpeggio performance on the guitar or four bars of percussion performance, for example. In the present embodiment, a predetermined time length (one to several measures) of waveform data supplied from the disk drive 4 or the mixer 15 is used as this phrase waveform.

In loop reproduction, this phrase waveform is repeatedly reproduced for a desired time. The unit of this repetition (loop) is the length of the phrase waveform, namely the length of the performed measures. Therefore, a performance concerned (for example, the above-mentioned two measures of arpeggio performance on the guitar) can be continued for any time length without involving a sense of discontinuity. In the present embodiment, the data to be loop-reproduced include the phrase waveform, performance data for automatic performance, a control sequence for realizing time variations such as volume and panning.

As described above, appropriate setting of the mixer 15 can alter, as desired, connection among the input/output of plural effects to be executed in the DSP 16, the input from the A/D converter 14, and the output to the write circuit 10. This in turn can alter combinations of effects and tone signals without restriction and can enhance the degree of freedom of adding or deleting the effects. In FIG. 1, a sound system 18 having an amplifier and a speaker sounds the tone signal supplied from the D/A converter 17.

Figure 2:
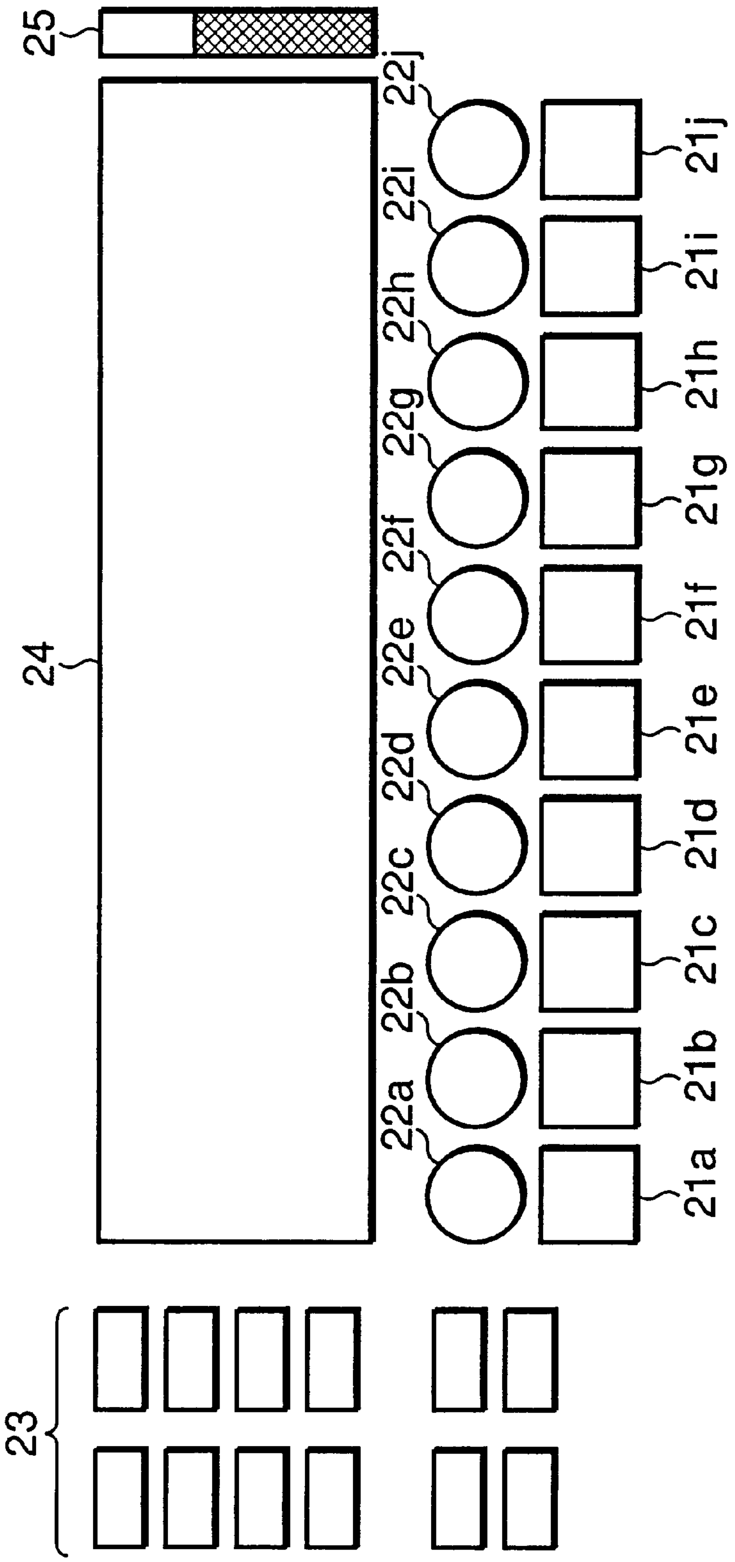
FIG. 2 is a schematic diagram illustrating an external view of a display and an operating panel of the electronic musical apparatus shown in FIG. 1.

FIG. 2 shows an external view of the main portion of the operating panel 2 and the display 3 of this electronic musical apparatus. In the figure, reference numerals 21*a* through 21*j* denote part pads for specifying parts. Reference numerals 22*a* through 22*j* denote part knobs for setting effects and levels thereof to be imparted to parts. Reference numeral 23 denotes an edit switch for setting types of data and effects to be assigned to parts. The CPU 7 executes processing according to the operations made by the user on these controls. It should be noted that alphabetic characters "a" through "j" attached to the above-mentioned part pads and the part knobs correspond to parts 1 through 10 to be described later.

The following outlines the processing to be executed in association with the operation made on the operating panel 2. It should be noted that, unless otherwise specified, the main portion of the following processing is executed by the CPU 7 and other components controlled by the CPU 7. First, an effect to be imparted to each part is selected by operating the edit switch 23. According to the operation of part knobs, effect levels of the corresponding parts and "enabled" or "disabled" of the effect concerned are set. When a part pad is pressed, data (performance data, phrase waveform, or control sequence) assigned to the pressed part pad is reproduced. Processing of the enabled effect or active effect set to the part is executed on the music tone generated by this data reproduction, thereby imparting the enabled or active effect to that music tone.

The part pads 21*a* through 21*d* are used for automatic performance. When automatic performance is made based on the performance data according to the operation of the pads 21*a* through 21*d*, music tone generation according to the performance event reproduced by this automatic performance is executed in the tone generator 11 by use of the waveform data of standard timbres recorded in the write-prohibited area of the waveform memory 9. The part pads 21*e* through 21*h* are used for phrase sampling, to which are assigned the waveform data (phrase data) recorded in the rewritable area of the waveform memory 9. It should be noted that each of the part pads 21*a* through 21*h* can select loop reproduction of assigned performance data or a phrase waveform.

Further, the part pad 21*i* is assigned to an external input, and the part pad 21*j* serves as a master. These pads 21*i* and 21*j* can select loop reproduction of an assigned control sequence. The master herein denotes all parts to be inputted into the DSP 16. When an effect is set to the part pad 21*j*, this effect is imparted to all parts.

Referring to FIG. 2 again, reference numeral 24 denotes a display for displaying an operating state and settings of this electronic musical apparatus. Reference numeral 25 denotes an indicator for indicating, in an analog manner, the ratio of work load of the DSP 16 relative to its maximum capacity. Obviously, the operating panel 2 and the display 3 are provided with controls such as knobs and a power on/off indicator for example that are generally arranged on electronic musical instruments. The description of these controls will be skipped for the sake of simplicity.

Figure 3:
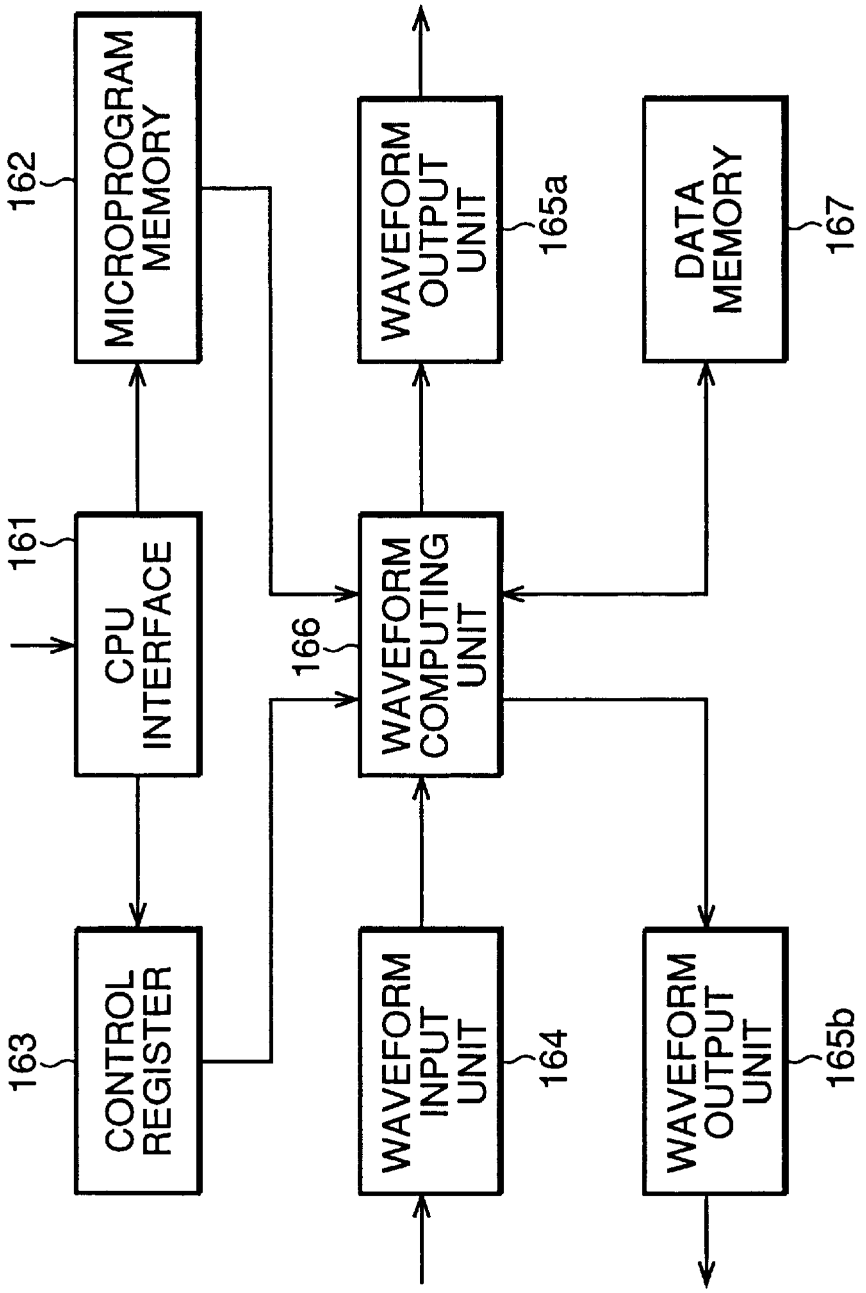
FIG. 3 is a block diagram illustrating, in a simplified form, a constitution of a DSP of the effector shown in FIG. 1.

FIG. 3 shows a block diagram illustrating a simplified constitution of the DSP 16. In the figure, a CPU interface 161 receives microprograms and control data sent from the CPU 7. An internal microprogram memory 162 stores the microprograms supplied through the CPU interface 161. The microprogram memory 162 has a storage size corresponding to the operating clock count (the clock count of instructions to be executed) within one sample period of waveform. The microprogram memory 162 can divide its internal storage area into blocks. These blocks may have different storage sizes or an equal storage size. The DSP 16 is constituted such that the parts to be processed by the microprogram stored in each of the blocks can be set in all or one by one.

A control register 163 holds control data received through the CPU interface 161. A waveform input unit 164 receives time-divisionally multiplexed waveform data. Waveform output units 165*a* and 165*b* output waveform data. A waveform computing unit 166 executes various computing operations (product-sum operation and so on) on the waveform data inputted from the waveform input unit 164 or past waveform data, and supplies the result of computation to the waveform output unit 165*a* or 165*b*. A data memory 167 stores data to be read from or written to the waveform computing unit 166, and is used when computation of an effect such as reverberation that requires past waveform data is executed.

The above-mentioned microprogram instructs various computational operations to be executed in the waveform computing unit 166 and the read/write operations to be executed between the waveform computing unit 166 and the data memory 167. The above-mentioned control data specifies the contents of the computational operations to be executed in the waveform computing unit 166 and the addresses of read/write operations with the data memory 167. These microprogram and control data are sequentially read in synchronization with the system operating clock to be supplied to the waveform computing unit 166. It should be noted that the frequency of the system operating clock is set to a level sufficiently higher than the sampling frequency (in the present embodiment, 44.1 kHz). For example, in the present embodiment, the system operating clock is 512 times as high as the sampling frequency. This DSP 16 can execute plural microprograms for every sampling period. However, the number of microprograms executable concurrently is limited by the total number of microprogram steps of 512.

Figure 4:
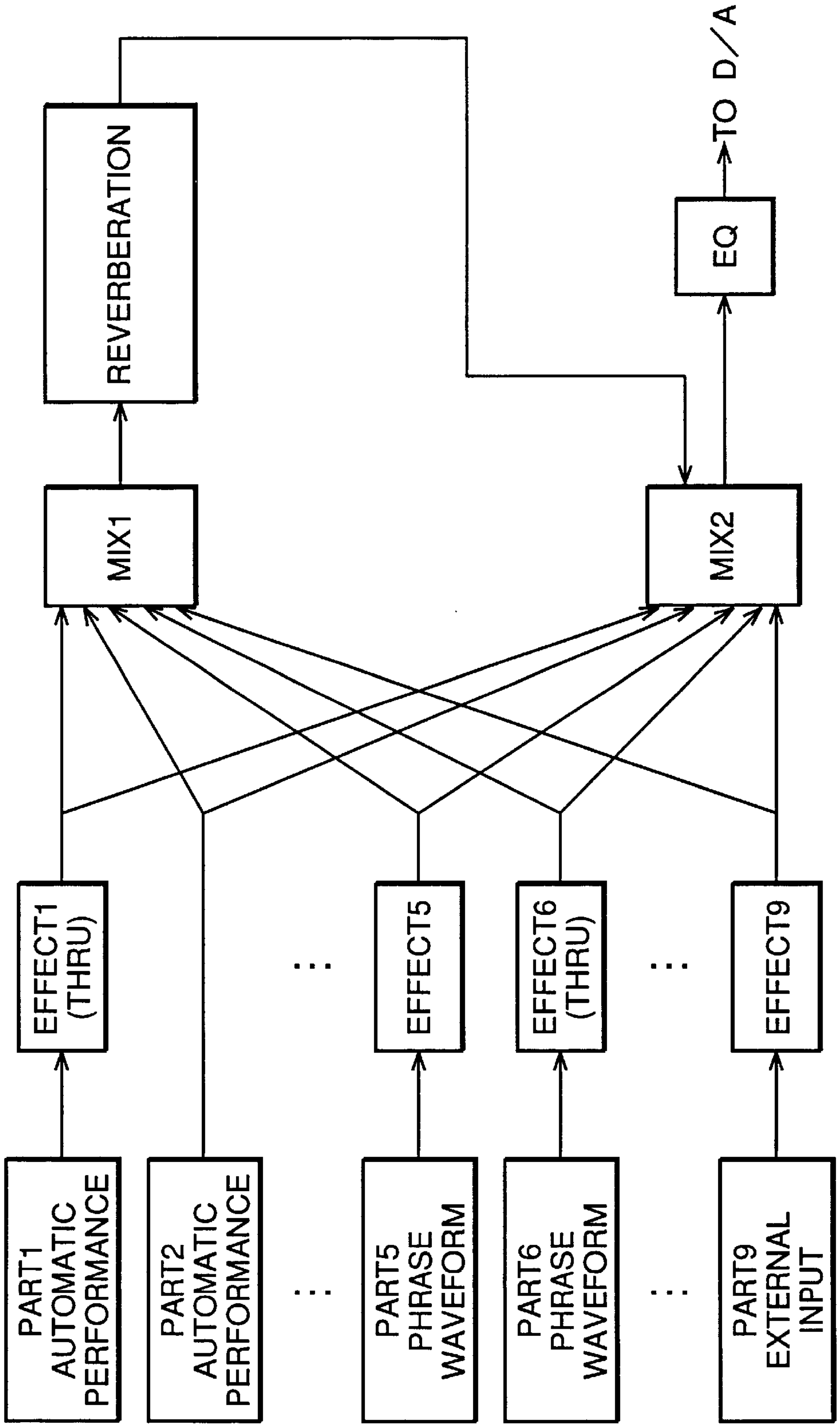
FIG. 4 is a block diagram illustrating an example of a constitution of an effect imparting portion of the effector shown in FIG. 1.

FIG. 4 shows a block diagram illustrating an example of logical constitution of the effector in operation. In the figure, the part pads 21*a* through 21*i* are regarded as part pads 1 through 9. The parts and effects assigned to these part pads are regarded as parts 1 through 9 and effects 1 through 9. In the example of FIG. 4, effects 1, 5, 6, and 9 are set to parts 1, 5, 6, and 9, respectively. No effect is set to the other parts. To parts 1 and 6, effects 1 and 6 are set, respectively. However, the corresponding part knobs are set to level 0, and therefore these parts are actually in the THRU (invalid or inactive) state.

In the example of FIG. 4, plural pieces of past waveform data are imparted with corresponding effects and then mixed. The mixed waveform data is imparted with reverberation. The resultant waveform data is mixed with the waveform data obtained by imparting corresponding effects to plural pieces of current waveform data. Then, the resultant mixed waveform data is imparted with an equalizer (EQ) effect. The equalized waveform data is outputted to the D/A 17. Namely, this constitution logically uses two mixers MIX1 and MIX2; actually, however, this constitution is realized by use of a physically single mixer as described before.

According to the invention, the music effector apparatus is constructed for processing a digital audio signal to produce a music sound while imparting acoustic effects to the music sound by executing microprograms corresponding to the acoustic effects. In the music effector apparatus, the digital signal processor 16 has a process capacity only sufficient to execute a limited number of microprograms in parallel to each other to create corresponding acoustic effects in production of the music sound. The operating panel 2 is manually operable when changing the acoustic effects during the production of the music sound for setting an acoustic effect to a zero level so that the corresponding microprogram is made inactive, and for setting another acoustic effect to other level than the zero level so that the corresponding microprogram is made active. The controller in the form of CPU 7 controls the digital signal processor 16 to execute one or more of the active microprograms within the limited number while skipping execution of the inactive microprogram to thereby achieve efficient use of the process capacity of the digital signal processor.

Preferably, the operating panel 2 is operable in advance of the production of the music sound for presetting an excess number of microprograms over the limited number for selective use of corresponding acoustic effects. The operating panel 2 is operable during the course of the production of the music sound for dynamically setting one or more of the acoustic effect to the zero level so as to reduce the number of active ones of the preset microprograms within the limited number.

Preferably, the digital signal processor 16 includes the internal memory 162 having a memory capacity sufficient to load the limited number of the microprograms for execution thereof. In such a case, the controller comprises an unloader operative during the processing of the audio signal for unloading the inactive microprogram from the internal memory 162, and a loader operative during the processing of the audio signal for loading the active microprogram into the internal memory 162 in place of the unloaded inactive microprogram so that the microprograms to be executed during the processing of the audio signal can be changed within the limited number. Alternatively, the digital signal processor 16 includes an internal memory having a memory capacity sufficient to store all of the microprograms including active ones and inactive ones. In such a case, the controller selectively retrieves the active microprograms from the internal memory for execution by the digital signal processor 16.

Practically, the music effector apparatus is provided with the display 3 activated when the number of the active microprograms exceeds the limited number for visually indicating an alarm such that the operating panel 2 can be manually operated to change at least one of the active microprograms to an inactive one by setting the acoustic effect to be created by the active microprogram to the zero level.

Figure 5:
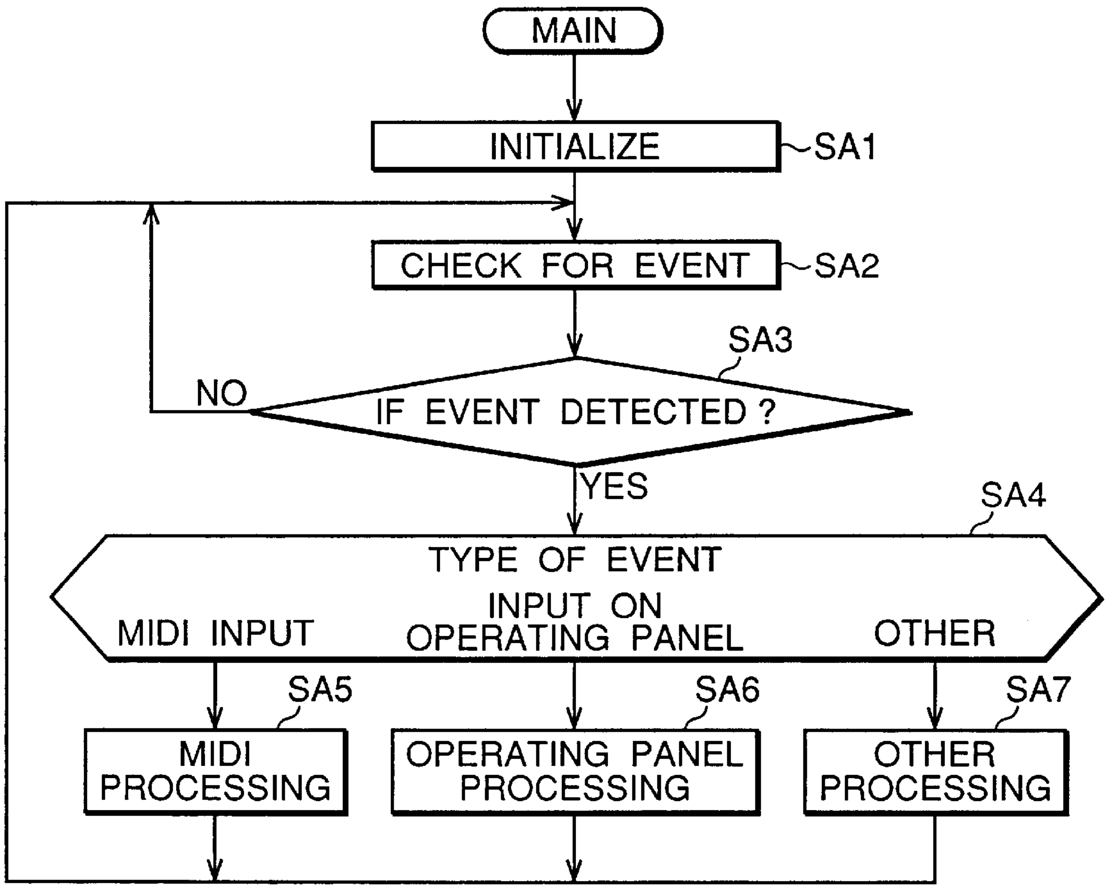
FIG. 5 is a flowchart indicative of basic operation of the electronic musical apparatus shown in FIG. 1.

The following describes the operation of the electronic musical apparatus having the above-mentioned effector. FIG. 5 is a flowchart indicative of the basic operation of this electronic musical apparatus. As shown, when the electronic musical apparatus is powered on, the CPU 7 executes initialization (step SA1) and repeats the processing of step SA2 and subsequent steps. In step SA2, the CPU 7 checks for an event caused by an operation made by the user or else. In step SA3, the CPU 7 determines whether there occurs such an event. If no event has been detected, control is returned to the processing of step SA2. If an event has been detected, the CPU 7 identifies the type of that event (step SA4). Then, the CPU 7 executes processing according to the identified type of the event (steps SA5, SA6, and SA7). When this processing has been completed, control is returned to the processing of step SA2.

The events supported herein include inputting of MIDI data via the MIDI interface 1, an operation made on the operating panel 2, and others. The operation to be executed when any of the other events has been detected is the same as that of conventional electronic musical instruments, so that the description of this operation will be skipped for the sake of simplicity. The following describes the operations to be executed when MIDI data is inputted and the operating panel is operated.

The operation to be executed when MIDI data is inputted is as follows. In this electronic musical apparatus, the parts 1 through 10 directly correspond to MIDI channels 1 through 10. In the channels 1 through 4 corresponding to the automatic performance parts, tone generation is executed based on the waveform data of the above-mentioned standard timbres according to the input of a note-on event or the like of MIDI data. In addition, the inputted MIDI data can be recorded and the recorded MIDI data can be stored in RAM 8 as performance data. On the other hand, in the channels 5 through 8 corresponding to the phrase waveform parts and in the remaining channels 9 and 10, the tone generation according to a note-on event or the like is not executed. In channels 1 through 10, the MIDI data indicative of a part pad operation can be inputted. According to the input, the CPU 7 executes the processing equivalent to the performance of the corresponding part pad. It should be noted that the other control operations associated with MIDI data are the same as those of conventional electronic musical instruments, and therefore their description will be skipped for the sake of simplicity.

Figure 6A:
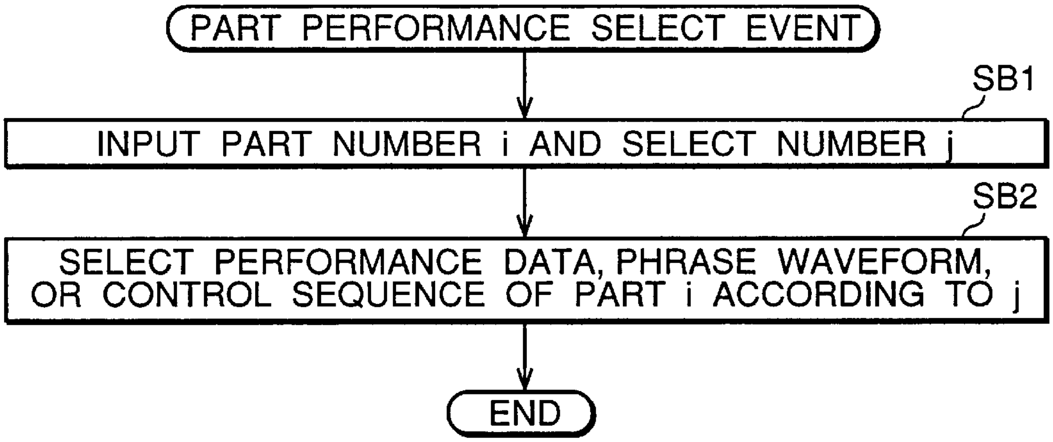
FIGS. 6(*a*) through 6(*c*) are flowcharts indicative of operations of the effector to be executed when an operating event occurs on the operating panel shown in FIG. 2.
Figure 6B:
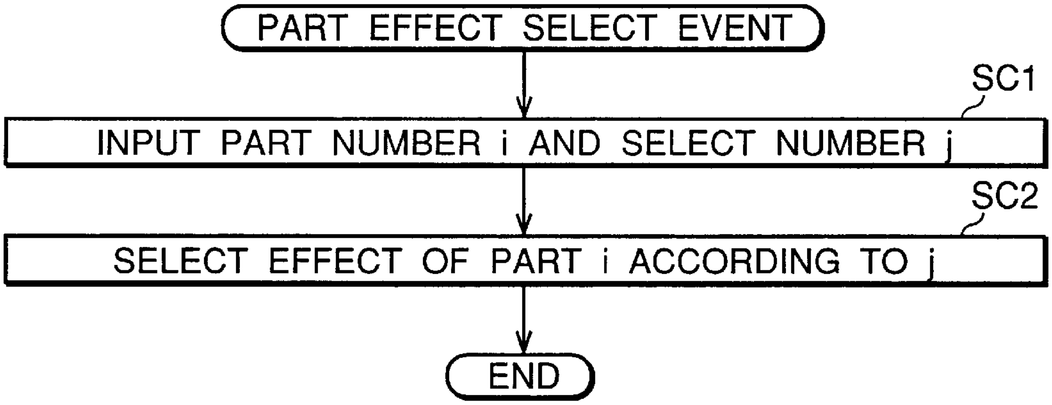
Figure 6C:
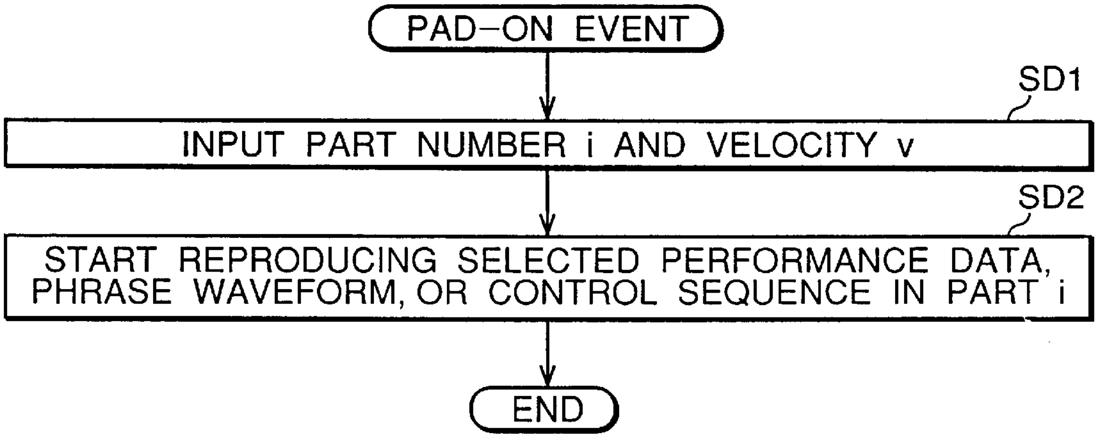
Figure 7:
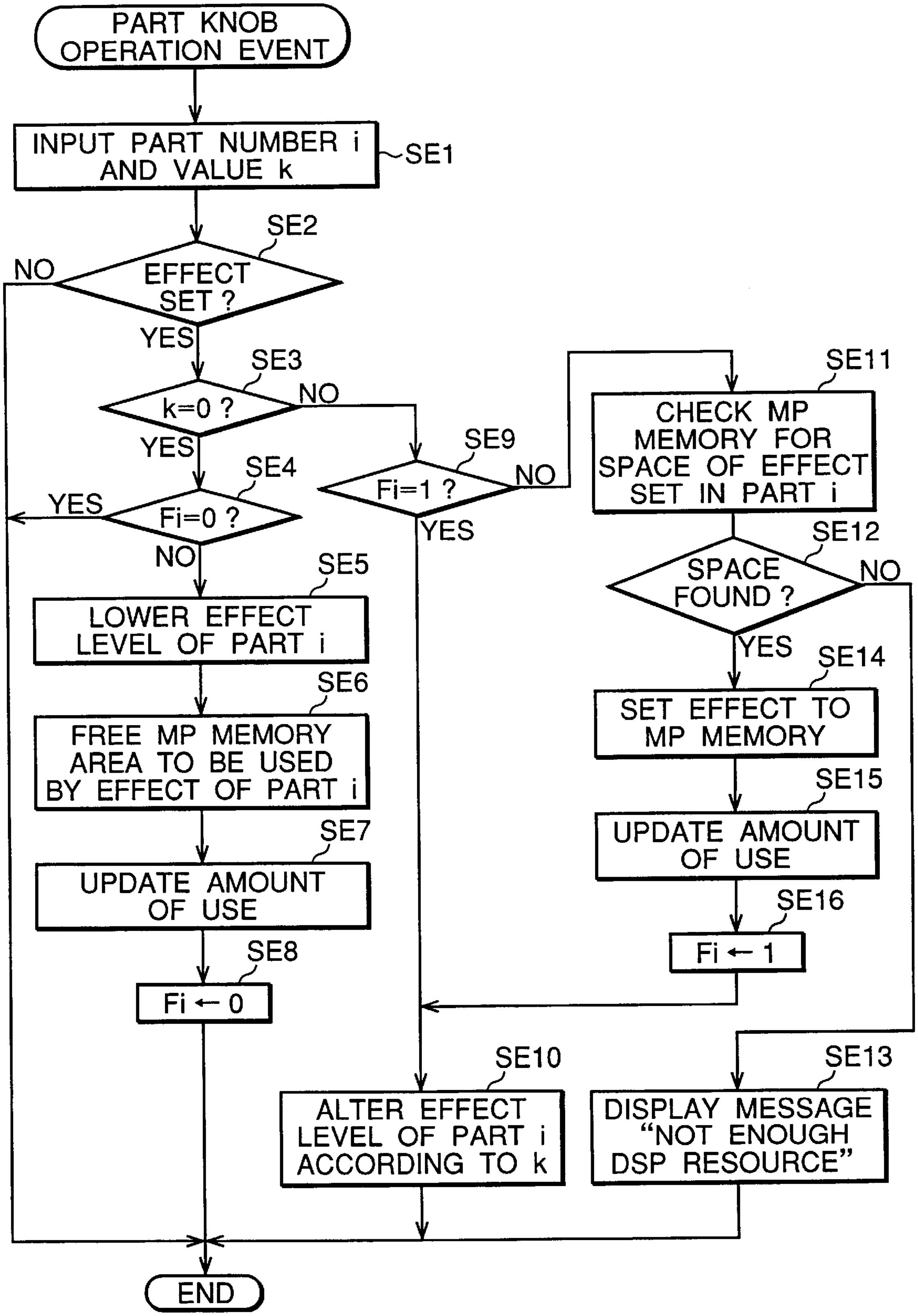
FIG. 7 is a flowchart indicative of an operation of the effector to be executed when an operating event occurs on the operating panel shown in FIG. 2.

The following describes the operations to be executed when the operating panel is operated with reference to FIGS. 6(*a*) through 6(*c*) and FIG. 7. FIGS. 6(*a*) through 6(*c*) and FIG. 7 are flowcharts indicative of the operations of this electronic musical apparatus to be executed when an operating panel event occurs. FIGS. 6(*a*) and 6(*b*) indicate the processing to be executed before performance starts. FIG. 6(*c*) and FIG. 7 indicate the processing to be executed during performance.

FIG. 6 (*a*) shows an operation to be executed when a part performance select event occurs; namely an operation to be executed when a switch for assigning data (performance data, a phrase waveform, or a control sequence) to each part is pressed among the edit switches 23. As shown, the CPU 7 first inputs part number i for assigning the data, and selects number j indicative of the content of the data to be assigned (step SB1). To be more specific, the CPU 7 inputs the number of the pressed part pad as part number i and the number given to the pressed edit switch 23 as select number j. Then, the CPU 7 assigns the data indicated by select number j to the part (namely, the part corresponding to the pressed part pad) indicated by part number i (step SB2). Namely, in automatic performance parts 1 through 4, one piece of automatic performance data is selected. In phrase sampler parts 5 through 8, one phrase waveform is selected. In external input part 9, one control sequence for controlling one part is selected. Likewise, in master part 10, one control sequence for controlling all parts is selected according to select number j. It should be noted that the performance data and the control sequences are stored in the ROM 6 or the RAM 8 beforehand.

Next, the CPU 7 executes part effect select event processing shown in FIG. 6(*b*) on the parts thus assigned with the data. However, the order of the processing is not necessarily the same as shown above. For example, the processing shown in FIG. 6(*a*) may be executed after the processing shown in FIG. 6(*b*). As shown in FIG. 6(*b*), when one of the edit switches 23 for setting an effect to a part is pressed, the CPU 7 inputs part number i of the part to which the effect is to be set, and selects number j indicative of the effect to be set (step SC1). Then, the CPU 7 sets the effect indicated by select number j to the part indicated by part number i (step SC2). The information associated with the part thus set is stored in the RAM 8. It should be noted that, as shown in FIG. 4, "select no effect" may be selected in setting the parts.

On the other hand, when a part pad is pressed during performance, the CPU 7 inputs part number i given to the pressed part pad and velocity v (part pad pressing velocity) of the pressed part pad as shown in FIG. 6(*c*) (step SD1). Then, the CPU 7 reproduces the performance data, the phrase waveform, or the control sequence assigned to the part (hereafter referred to as part i) indicated by part number i (step SD2). At this moment, the volume of reproduction is controlled by velocity v. The following specifically describes the processing of step SD2 in different cases.

(1) If an automatic performance part pad (21*a* to 21*d*) is operated, the CPU 7 starts automatic performance based on the performance data assigned to the operated pad. Namely, the CPU 7 starts a timer for counting time and sequentially reproduces performance events with timings specified by duration data included in the performance data. Then, the CPU 7 controls sounding of the tone generator 11, the mixer 15, the DSP 16, and so on according to the reproduced performance events.

(2) If a phrase waveform part pad (21*e* to 21*h*) is operated, the CPU 7 instructs the tone generator 11 to start reproducing the waveform data of the phrase waveform assigned to the operated pad.

(3) If the external input part pad or the master part pad (21*i*, 21*j*) is operated, the CPU 7 starts automatic control based on the control sequence assigned to the operated pad. Namely, the CPU 7 starts the timer for counting time and sequentially reproduces the control events with timings specified by the duration data included in the control sequence. Then, the CPU 7 controls the mixer 15 and the DSP 16 according to the reproduced control events.

It should be noted that loop reproduction may be set for each part. In a part with loop reproduction set, automatic performance data, a phrase waveform, or a control sequence is reproduced repeatedly.

If a part knob is operated during performance, the CPU 7 inputs part number i corresponding to the operated knob and setting value k of the level indicated by the operated knob (step SE1) as shown in FIG. 7. Then, the CPU 7 references the contents of the RAM 8 and determines whether an effect has been set to part i (step SE2). If the decision is NO, the CPU 7 ends this processing; if the decision is YES, the CPU 7 determines whether the setting value k is 0 or not (step SE3).

If the decision is YES in step SE3, namely, k=0, the CPU 7 determines whether the effect for part i is valid or not (step SE4). In the present electronic musical apparatus, if the effect of part i is valid or active, flag Fi is set to "1"; if the effect of part i is invalid or inactive, flag Fi is set to "0". Therefore, the above-mentioned decision is realized by determining whether flag Fi is "1" or not. If the decision in step SE4 is YES, namely if the setting value of the level of the effect which is invalid from the beginning is set to 0, the CPU 7 ends this processing.

If the decision is NO, namely, if the setting value of the level of the valid effect is set to 0, the CPU 7 executes the following processing. To be specific, in step SE5, the CPU 7 alters the control data corresponding to part i such that the effect level of part i is set to 0 and sends the altered control data to the DSP 16. Then, the CPU 7 frees the area in the microprogram memory 162 so far used by the effect set to part i (step SE6), updates the value of the indicator 25 (step SE7), substitutes "0" into Fi (step SE8), and ends this processing.

It should be noted that the CPU 7 always recognizes the number of microprograms set to the DSP 16 and the size (the number of program steps) of each of these microprograms. Comparing the total of these sizes with the operating clock count (the maximum number of steps) for each sampling period that can be set by the DSP 16, the CPU 7 determines the value displayed on the indicator 25. It should be noted that the processing of step SES is provided to prevent noise from being caused when the effect processing of part i is stopped.

On the other hand, if the decision in step SE3 is NO, the CPU 7 determines whether Fi is "1" or not (step SE9). If this decision is YES, it indicates that the setting value of the level of the effect that is valid from the beginning has been altered to other than 0. In this case, the CPU 7 operates according to the setting value k to alter the mixing ratio or control data corresponding to part i such that the level of the effect of part i is altered, sends the altered mixing ratio or control data to the mixer 15 or the DSP 16 (step SE10), and ends this processing. It should be noted that the level of each effect is controlled by the mixing ratio of the mixer 15 and the coefficient of the DSP 16.

Conversely, if the decision of step SE9 is NO, it indicates that the setting value of the level of the invalid effect has been altered to other than 0. In this case, the CPU 7 checks the microprogram memory 162 for any free area (step SE11). The CPU 7 determines whether the memory has a free area (an area capable of storing one microprogram) in which the effect to be set to part i can be realized (step SE12). If this decision is NO, the CPU 7 displays a message "NOT ENOUGH DSP RESOURCE" on the display 3 and ends this processing (step SE13).

On the other hand, if the decision of step SE12 is YES, the CPU 7 loads the microprogram for realizing this effect to the DSP 16 to make the DSP 16 store this microprogram into the microprogram memory 162 (step SE14). Then, the CPU 7 updates the value of the indicator 25 (step SE15), substitutes "1" into Fi (step SE16), alters the level of the new effect to be realized by this microprogram according to the setting value k (step SE10), and ends this processing.

The following describes an example of a particular operation made by the user with reference to FIG. 4. It is assumed hereafter that the storage capacity of the microprogram 162 is equivalent to 512 program steps. It is also assumed that, of the plural effects that have been set, reverberation having 256 steps, effect 5 having 128 steps and set to part 5, and effect 9 having 96 steps and set to part 9 are concurrently in operation.

In the situation shown in FIG. 4, if the user attempts to raise the setting value of the level of the effect of part 6 by operating the corresponding part knob, message "NOT ENOUGH DSP RESOURCE" appears on the display 3, and therefore the level setting value cannot be raised. If this happens, the user selects an unnecessary effect (for example, effect 9) and lowers the setting value of the level of this effect to 0. This yields a free area of 128 steps to the microprogram memory 162. Therefore, the microprogram having 128 steps for realizing the effect 6 set to part 6 can be stored in this newly yielded area. Subsequently, when the user raises the setting value of the level of the effect of part 6 by operating the part knob corresponding to part 6, the microprogram for realizing effect 6 is stored in the above-mentioned free area, and the effect is imparted to the tone of part 6 in a depth according to that level. Instead of creating the free area by inactivating the effect of part 9 as described above, currently selected reverberation of 256 steps may be changed to another reverberation having 160 steps to create the free space. This effect change can be realized by operating the edit switch 23.

As described and according to the present embodiment, the number of effects exceeding the processing capacity of the DSP can be set before starting performance. In addition, because the user can instantly recognize the load on the DSP (DSP usage amount), the user can lower the level of an unnecessary effect to make the most of the limited DSP processing capacity or resources.

In the above-mentioned embodiment, the number of parts to which one effect (one microprogram) is imparted is one or all. It will be apparent that an alternative may also be provided. In the above-mentioned example, one effect is set to each part. It will be apparent that two or more effects may be set to each part or two or more effects may be set regardless of parts. In the above-mentioned example, the pressing velocity (velocity v) of a part pad is inputted. It will be apparent that the pressing velocity may be inputted in another method, or the inputting of velocity v itself may be omitted. In the above-mentioned example, the present invention is applied to the hardware DSP. It will be apparent that the present invention is also applicable to the software DSP to be implemented by the CPU. The RAM 8 may be provided with the capability of the data memory 167 for shared use by the CPU 7 and the DSP 16. The RAM 8 may also be provided with the capability of the microprogram memory 162 for shared use by the CPU 7 and the DSP 16.

The storage capacity of the microprogram memory 162 may be made large enough for storing all microprograms to be used in the DSP 16. In this case too, the number of steps (the operating clock count within one sampling period) of microprograms that the DSP 16 can executed in one sampling period is limited, so that the same control as that of the above-mentioned embodiment is required. The following describes this control. In the basic processing operation, of all microprograms stored in the microprogram memory 162, those assigned to parts with effect levels other than 0 are sequentially and selectively supplied to the waveform computing unit 166 in each sampling period. In this situation, in order to set an effect level other than 0, the CPU 7 determines whether there is a space in the operating clock count enough for executing a new effect at each sampling frequency as described in step SE12. If no such a space is found, the CPU 7 displays message "NOT ENOUGH DSP RESOURCE". If an enough resource is found, the CPU 7 instructs the DSP 16 to start processing operation including the new effect.

As described above, the inventive method of imparting acoustic effects to an audio signal by executing microprograms comprises the steps of operating a digital signal processor having a process capacity only sufficient to execute a limited number of microprograms in parallel to each other to create acoustic effects in processing of the audio signal, individually selecting the microprograms during the course of the processing of the audio signal, setting a level of the acoustic effect to be created by each of the selected microprograms so that each microprogram is made inactive when the acoustic effect thereof is set to a zero level and otherwise is made active when the acoustic effect is set to other than the zero level, and controlling the digital signal processor to execute each active microprogram within the limited number while skipping execution of each inactive microprogram to thereby achieve efficient use of the process capacity of the digital signal processor.

Preferably, the step of setting comprises presetting an excess number of microprograms over the limited number for selective use of the microprograms in advance of the processing of the audio signal, and dynamically setting the level of the acoustic effect to be created by each microprogram during the course of the processing of the audio signal so as to reduce the number of active ones of the preset microprograms within the limited number.

Preferably, the inventive method further comprises the step of indicating an alarm when the number of the active microprograms exceeds the limited number such that the step of setting can be manually conducted to change at least one of the active microprograms to an inactive one by setting the acoustic effect to be created by the active microprogram to the zero level.

The electronic musical apparatus to which the present invention is applied may be any types of keyboard, stringed, wind, and percussion. In addition to the electronic musical apparatus incorporating a tone generator, the present invention is applicable to a system in which the tone generator is provided separately from the main frame and both are connected by communication means such as MIDI and a network. Further, a system to which the present invention is applied may be implemented by a general-purpose computer rather than in the form of a typical electronic musical instrument.

In the above-mentioned embodiment, the control program and microprograms are stored in the ROM to be read by the CPU for realizing various capabilities. It will be apparent that a magnetic disk, an optical disk, a magneto-optical disk, or a semiconductor memory may be used for the machine readable medium of application software. In this case, use of a removable machine readable medium facilitates updating of the control program.

Alternatively, a communication interface may be provided to download the control program and/or microprograms over a communication network for execution. The following describes an example in which the control program is downloaded from a network. The communication interface is connected to a server computer through LAN (Local Area Network), the Internet, or a public telephone line. If the control program or micrograms are not stored in its machine readable medium, the client computer sends a command to the server computer through the communication interface and the communication network, requesting for the necessary programs. Receiving the command, the server computer distributes the requested data to the client computer over the communication network. The client computer receives the data and stores it into the machine readable medium, upon which the downloading is completed.

As described and according to the invention, the digital signal processor is adapted to execute microprograms of which sound effect levels are other than 0, while not executing microprograms of which sound effect levels are 0. Consequently, the processing capacity of the digital signal processor need not be allocated to the processing of sound effects of no use. This allows setting of the number of sound effects exceeding the processing capacity of the digital signal processor if the number of sound effects to be used simultaneously is relatively small. In addition, the load to be applied to the digital signal processor is displayed, so that the user can set the sound effect level such that the load will not exceed the processing capacity of the digital signal processor.

While the preferred embodiments of the present invention have been described using specific terms, such description is for illustrative purposes only, and it is to be understood that changes and variations may be made without departing from the spirit or scope of the appended claims.

What is claimed is:

1. An apparatus for imparting acoustic effects to an audio signal by executing microprograms every sampling period, the apparatus comprising:

processing means having a process capacity only sufficient to execute a limited number of microprogram steps of microprograms within one sampling period to create acoustic effects in processing of the audio signal;

selecting means operable in advance of the processing of the audio signal for selecting a number of microprograms comprising a first total number of microprogram steps over the limited number of microprogram steps;

setting means for setting a level of the acoustic effect to be created by each of the selected microprograms so that each microprogram is made inactive when the acoustic effect thereof is set to a zero level and otherwise is made active when the acoustic effect is set to other than the zero level; and controlling means for controlling the processing means to execute the active microprograms comprising a second total number of microprogram steps within the limited number of microprogram steps while each inactive microprogram is not executed to thereby achieve efficient use of the process capacity of the processing means.

2. The apparatus according to claim 1, wherein the setting means includes means manually operable during the processing of the audio signal for selecting a desired one of the audio effects and for changing the level of the selected audio effect.

3. The apparatus according to claim 1, wherein the processing means includes memory means having a memory capacity sufficient to load microprograms comprising the limited number of microprogram steps for execution thereof, and wherein the controlling means comprises unloading means operative during the processing of the audio signal for unloading the inactive microprogram from the memory means, and loading means operative during the processing of the audio signal for loading the active microprogram into the memory means in place of the unloaded inactive microprogram so that a total number of microprogram steps to be executed during the processing of the audio signal can be changed within the limited number of microprogram steps.

4. The apparatus according to claim 1, wherein the processing means includes memory means having a memory capacity sufficient to store all of the selected microprograms, and wherein the controlling means comprises means for selectively retrieving the active microprograms from the memory means for execution by the processing means.

5. The apparatus according to claim 1, further comprising alarm means operative when a total number of microprogram steps corresponding to the number of the active microprograms exceeds the limited number of microprogram steps for indicating an alarm such that the setting means can be manually operated to change at least one of the active microprograms to an inactive one by setting the acoustic effect to be created by the active microprogram to the zero level.

6. A music effector apparatus for processing a digital audio signal to produce a music sound while imparting acoustic effects to the music sound by executing microprograms every sampling period corresponding to the acoustic effects, the music effector apparatus comprising:

a digital signal processor that has a process capacity only sufficient to execute a limited number of microprogram steps of microprograms within one sampling period to create corresponding acoustic effects in production of the music sound;

an operating panel operable in advance of the processing of the audio signal for selecting a number of microprograms comprising a first total number of microprogram steps over the limited number of microprogram steps, said operating panel manually operable when changing the acoustic effects during the production of the music sound for setting an acoustic effect to a zero level so that the corresponding microprogram is made inactive, and for setting another acoustic effect to other level than the zero level so that the corresponding microprogram is made active; and a controller that controls the digital signal processor to execute the active microprograms comprising a second total number of microprogram steps within the limited number of microprogram steps while each inactive microprogram is not executed to thereby achieve efficient use of the process capacity of the digital signal processor.

7. The music effector apparatus according to claim 6, wherein the digital signal processor includes an internal memory having a memory capacity sufficient to load microprograms comprising the limited number of microprogram steps for execution thereof, and wherein the controller comprises an unloader operative during the processing of the audio signal for unloading the inactive microprogram from the internal memory, and a loader operative during the processing of the audio signal for loading the active microprogram into the internal memory in place of the unloaded inactive microprogram so that a total number of microprogram steps to be executed during the processing of the audio signal can be changed within the limited number of microprogram steps.

8. The music effector apparatus according to claim 6, wherein the digital signal processor includes an internal memory having a memory capacity sufficient to store all of the selected microprograms, and wherein the controller selectively retrieves the active microprograms from the internal memory for execution by the digital signal processor.

9. The music effector apparatus according to claim 6, further comprising a display activated when a total number of microprogram steps corresponding to the number of the active microprograms exceeds the limited number of microprogram steps for visually indicating an alarm such that the operating panel can be manually operated to change at least one of the active microprograms to an inactive one by setting the acoustic effect to be created by the active microprogram to the zero level.

10. A method of imparting acoustic effects to an audio signal by executing microprograms every sampling period, comprising the steps of:

operating a digital signal processor having a process capacity only sufficient to execute a limited number of microprogram steps of microprograms within one sampling period to create acoustic effects in processing of the audio signal;

selecting in advance of the processing of the audio signal a number of microprograms comprising a first total number of microprogram steps over the limited number of microprogram steps;

setting a level of the acoustic effect to be created by each of the selected microprograms so that each microprogram is made inactive when the acoustic effect thereof is set to a zero level and otherwise is made active when the acoustic effect is set to other than the zero level; and controlling the digital signal processor to execute the active microprograms comprising a second total number of microprogram steps within the limited number of microprogram steps while each inactive microprogram is not executed to thereby achieve efficient use of the process capacity of the digital signal processor.

11. The method according to claim 10, further comprising the step of indicating an alarm when a total number of microprogram steps corresponding to the number of the active microprograms exceeds the limited number of microprogram steps such that the step of setting can be manually conducted to change at least one of the active microprograms to an inactive one by setting the acoustic effect to be created by the active microprogram to the zero level.

12. A machine readable medium for use in an effector apparatus having a CPU and a digital signal processor for imparting acoustic effects to an audio signal by executing microprograms every sampling period, the medium containing instructions executable by the CPU for causing the effector apparatus to perform the steps of:

operating a digital signal processor having a process capacity only sufficient to execute a limited number of microprogram steps of microprograms within one sampling period to create acoustic effects in processing of the audio signal;

selecting in advance of the processing of the audio signal a number of microprograms comprising a first total number of microprogram steps over the limited number of microprogram steps;

setting a level of the acoustic effect to be created by each of the selected microprograms so that each microprogram is made inactive when the acoustic effect thereof is set to a zero level and otherwise is made active when the acoustic effect is set to other than the zero level; and controlling the digital signal processor to execute the active microprograms comprising a second total number of microprogram steps within the limited number of microprogram steps while each inactive microprogram is not executed to thereby achieve efficient use of the process capacity of the digital signal processor.

13. The machine readable medium according to claim 12, further containing instructions executable by the CPU for causing the effector apparatus to perform the step of indicating an alarm when a total number of microprogram steps corresponding to the number of the active microprograms exceeds the limited number of microprogram steps such that the step of setting can be manually conducted to change at least one of the active microprograms to an inactive one by setting the acoustic effect to be created by the active microprogram to the zero level.

* * * * *